(12) United States Patent
Trundle

(10) Patent No.: US 10,274,382 B1
(45) Date of Patent: Apr. 30, 2019

(54) PROACTIVE MANAGEMENT OF APPLIANCES

(71) Applicant: Alarm.com Incorporated, Tysons, VA (US)

(72) Inventor: Stephen Scott Trundle, Falls Church, VA (US)

(73) Assignee: Alarm.com Incorporated, Tysons, VA (US)

( * ) Notice: Subject to any disclaimer, the term of this patent is extended or adjusted under 35 U.S.C. 154(b) by 162 days.

(21) Appl. No.: 15/069,377

(22) Filed: Mar. 14, 2016

Related U.S. Application Data

(60) Provisional application No. 62/132,076, filed on Mar. 12, 2015.

(51) Int. Cl.
| | |
|---|---|
| *G01W 1/10* | (2006.01) |
| *F24F 11/30* | (2018.01) |
| *F24F 11/32* | (2018.01) |
| *F24F 11/46* | (2018.01) |
| *F24F 11/62* | (2018.01) |
| *F24F 11/70* | (2018.01) |
| *G01K 13/00* | (2006.01) |
| *G01R 22/06* | (2006.01) |

(Continued)

(52) U.S. Cl.
CPC .............. *G01K 13/00* (2013.01); *F24F 11/30* (2018.01); *F24F 11/62* (2018.01); *F24F 11/70* (2018.01); *G01R 22/06* (2013.01); *G01W 1/10* (2013.01); *G06Q 10/06* (2013.01); *F24F 11/32* (2018.01); *F24F 11/46* (2018.01); *F24F 2110/00* (2018.01); *F24F 2130/00* (2018.01); *F24F 2130/10* (2018.01); *F24F 2140/60* (2018.01)

(58) Field of Classification Search
None
See application file for complete search history.

(56) References Cited

U.S. PATENT DOCUMENTS 9,696,055 B1 * 7/2017 Goodman .......... G05D 23/1932
9,829,871 B1 * 11/2017 Goodman ............ G05B 19/041
(Continued)

OTHER PUBLICATIONS

Reasons You Need Seasonal HVAC Change Over Cooling Services, Jan. 29, 2014 downloaded from URL < https://web.archive.org/web/20140129142422/http://www.rr-heating-air.com/seasonal-hvac-changeover/> on Feb. 5, 2018.*

*Primary Examiner* — J. E. Schoenholtz
(74) *Attorney, Agent, or Firm* — Fish & Richardson P.C.

(57) ABSTRACT

In some implementations, a system performs proactive performance tests for an appliance before a time for an operational change in usage of the appliance. Usage data for an appliance associated with a property may be obtained. The obtained usage data indicates past activity of the appliance and present operational status of the appliance. Weather forecast data associated with a location of the property can be obtained. A time for an operational change in usage of the appliance can be predicted based at least on the obtained usage data for the appliance and the obtained weather forecast data. An operation directed to conducting one or more performance tests on the appliance can be performed before the predicted time for the operational change in usage of the appliance. One or more communications related to the one or more performance tests of the appliance can be provided to a client device.

20 Claims, 8 Drawing Sheets

(51) Int. Cl.
*G06Q 10/06* (2012.01)
*F24F 110/00* (2018.01)
*F24F 130/00* (2018.01)
*F24F 130/10* (2018.01)
*F24F 140/60* (2018.01)

(56) References Cited

U.S. PATENT DOCUMENTS

| | | | |
|---|---|---|---|
| 2011/0047418 A1* | 2/2011 | Drees | G05B 15/02 714/57 |
| 2012/0143356 A1* | 6/2012 | Berg-Sonne | G05B 15/02 700/49 |
| 2013/0158714 A1* | 6/2013 | Barton | F24F 11/30 700/276 |
| 2014/0266755 A1* | 9/2014 | Arensmeier | F24F 11/0086 340/679 |
| 2017/0206615 A1* | 7/2017 | Sloop | G05B 19/042 |

\* cited by examiner

PROACTIVE MANAGEMENT OF APPLIANCES

CROSS-REFERENCE TO RELATED APPLICATION

This application claims priority from U.S. Provisional Application No. 62/132,076, filed Mar. 12, 2015, and titled "PROACTIVE MANAGEMENT OF APPLIANCES," which is hereby incorporated by reference in its entirety.

TECHNICAL FIELD

This application generally relates to monitoring technology and, for example, HVAC systems.

BACKGROUND

Heating, ventilating and air conditioning (HVAC) units may perform cooling functions by using a refrigeration cycle to remove heat from air that is circulated over evaporator coils, and heating functions by using a furnace to heat air from a source vent and blowing the heated air through return vents.

SUMMARY

Techniques are described for detecting and monitoring seasonal changes that impact appliances that have operating conditions that differ by season. For instance, thermostats and heating, ventilating, and air conditioning (HVAC) systems have different seasonal operating conditions in that the air conditioner operates to cool a property in the summer and the heating unit operates to heat the property in the winter. The point of change between seasonal operating conditions (e.g., a change from cooling to heating) may place significant and atypical stress on the HVAC system because seasonal changes bring about use of HVAC components that have not been operated for a substantial period of time. These points of change and the significant and atypical stress that results may represent a higher than typical rate of failure of the HVAC system as compared to normal operation.

Accordingly, techniques are described to identify points of change in seasonal appliance usage and proactively test and correct any issues that are likely to arise due to seasonal changes in operation. Thermostats and HVAC systems are examples of seasonal appliances, but the techniques described throughout this disclosure may be applied to any type of seasonal appliances, such as pools, hot tubs, humidifiers, etc.

In some implementations, a system detects and monitors seasonal changes in thermostat state and the HVAC system resulting from shifts in seasonal weather patterns. In these implementations, the system monitors the historical and future weather patterns within a specified location, and also aggregates data over multiple monitored properties. The system may determine thermostat, ambient room temperature, and humidity trends based on weather pattern monitoring. The system also may determine the time frame for when thermostat state change (e.g., seasonal change in type of operation) will likely occur, and an optimal time to perform a proactive test measure the effectiveness of the system. The system may perform a proactive test using data from the thermostat and external sensors accessible to the system. The results of the proactive test may be sent to the user or to a trusted provider for subsequent service based on the performance of the test.

In some implementations, a computer-implemented method may include: obtaining usage data for an appliance associated with a property, the obtained usage data indicating past activity of the appliance and present operational status of the appliance; obtaining weather forecast data associated with a location of the property; predicting a time for an operational change in usage of the appliance based at least on the obtained usage data for the appliance and the obtained weather forecast data; before the predicted time for the operational change in usage of the appliance, performing an operation directed to conducting one or more performance tests on the appliance; and providing, to a client device, one or more communications related to the one or more performance tests of the appliance based at least on results of the one or more performance tests of the appliance.

Other versions of these and other aspects disclosed herein include corresponding devices, systems, and computer programs encoded on computer-readable storage devices that are configured to perform the actions of the methods. These and other aspects may include one or more of the features discussed below.

Implementations may include one or more optional features. For instance, in some implementations, the predicted time for the operational change in usage of the appliance reflects a change in seasonal operation of the appliance.

In some implementations, the method may include: determining to perform a maintenance operation on the appliance based at least on performing an operation directed to conducting the one or more performance tests on the appliance; and before the predicted time for the operational change in usage of the appliance, transmitting an instruction to the appliance to perform the maintenance operation.

In some implementations, predicting the time for the operational change in usage of the appliance includes: obtaining data associated with a plurality of properties determined to be nearby the property; identifying a subset of the obtained data that is related to the past activity of the appliance and the present operational status of the appliance; and predicting a time for an operational change in usage of the appliance based at least on the obtained usage data for the appliance, the obtained weather forecast data, and the subset of the obtained data from the plurality of properties.

In some implementations, the method includes: providing, to a device associated with a service provider of the property, one or more communications related to the one or more performance tests of the appliance based at least on results of the one or more performance tests of the appliance.

In some implementations, the appliance represents a component of a HVAC system associated with the property, and the predicted time for the operational change in usage of the appliance reflects a period of time when the component of the HVAC system is configured to be adjusted from either a cooling setting to a heating setting or a heating setting to a cooling setting.

In some implementations, the obtained usage data for the appliance includes temperature set point data from a thermostat associated with the HVAC system, energy consumption data associated with the HVAC system, and data indicating presence of individuals within the property.

In some implementations, the operation directed to conducting one or more performance tests on the appliance includes: measuring a power usage, an operating temperature, and a humidity associated with the component of the HVAC system; and comparing (i) the measured power usage to a target power usage, (ii) the measured operating temperature to a target operating temperature, and (iii) the measured humidity to a target humidity, where each of the values of the target power usage, the target operating temperature, and the target humidity are based on one or more user-defined settings of the property. Implementations of the described techniques may include hardware, a method or process implemented at least partially in hardware, or a computer-readable storage medium encoded with executable instructions that, when executed by a processor, perform operations.

The details of one or more implementations are set forth in the accompanying description below. Other features will be apparent from the description of the drawings.

DETAILED DESCRIPTION

Figure 1:
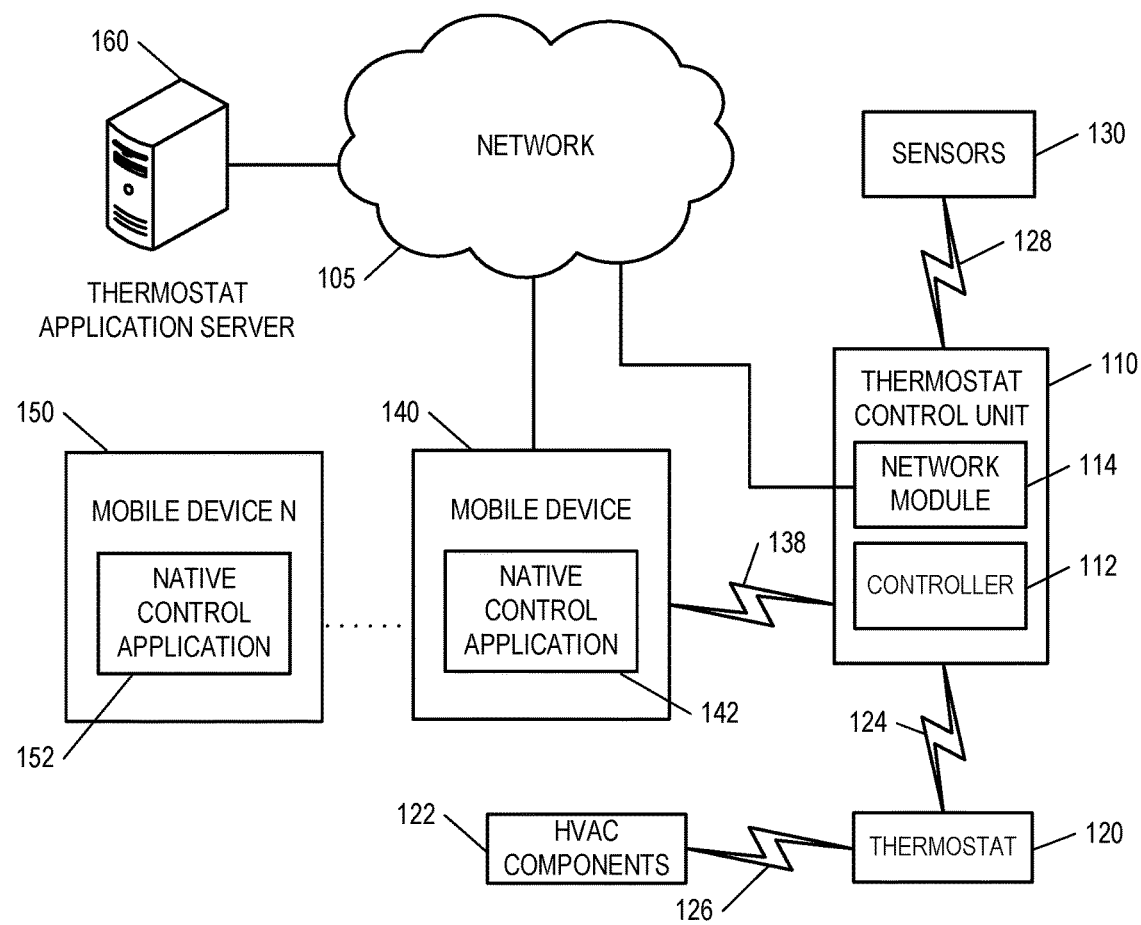
FIG. 1 illustrates an example of a control system configured to monitor thermostat state changes based on trend analysis of weather and usage patterns.

FIG. 1 illustrates an example of a control system 100 configured to monitor thermostat state changes based on trend analysis of weather and usage patterns. The control system 100 includes a network 105, a thermostat control unit 110, one or more mobile devices 140, 150, and an application server 160. The network 105 is configured to enable electronic communications between devices connected to the network 105. For example, the network 105 can be configured to enable exchange of electronic communications between the thermostat control unit 110, the one or more mobile devices 140, 150, and the application server 160.

The network 105 can include, for example, one or more of the Internet, Wide Area Networks (WANs), Local Area Networks (LANs), e.g., Wi-Fi, analog or digital wired and wireless telephone networks, e.g., a public switched telephone network (PSTN), Integrated Services Digital Network (ISDN), a cellular network, and Digital Subscriber Line (DSL), Ethernet, Internet Protocol (IP) over broadband, radio, television, cable, satellite, or any other delivery or tunneling mechanism for carrying data. Network 105 can include multiple networks or subnetworks, each of which can include, for example, a wired or wireless data pathway. The network 105 can include a circuit-switched network, a packet-switched data network, or any other network able to carry electronic communications (e.g., data or voice communications). For example, the network 105 can include networks based on the Internet protocol (IP), asynchronous transfer mode (ATM), the PSTN, packet-switched networks based on IP, X.25, or Frame Relay, or other comparable technologies and can support voice using, for example, VoIP, or other comparable protocols used for voice communications. The network 105 can include one or more networks that include wireless data channels and wireless voice channels. The network 105 can be a wireless network, a broadband network, or a combination of networks including a wireless network and a broadband network.

The thermostat control unit 110 includes a controller 112 and a network module 114. The controller 112 is configured to control a system, e.g., an HVAC system associated with a property, that includes the thermostat control unit 110. In some examples, the controller 112 can include a processor or other control circuitry configured to execute instructions of a program that controls operation of an HVAC system. In these examples, the controller 112 can be configured to receive input from sensors, detectors, or other devices associated with the HVAC system and control operation of components of the HVAC system, e.g., a furnace, humidifier, dehumidifier, or air conditioner, or other devices associated with the property, e.g., an appliance, lights, etc. For example, the controller 112 can be configured to control operation of the network module 114 included in the thermostat control unit 110.

The network module 114 is a communication device configured to exchange communications over the network 105. The network module 114 can be a wireless communication module configured to exchange wireless communications over the network 105. For example, the network module 114 can be a wireless communication device configured to exchange communications over a wireless data channel. In this example, the network module 114 can transmit user location data within or external to the property, environmental data from the property, e.g., indoors at the property or outdoors at the property, or other data over a wireless data channel. The wireless communication device can include one or more GSM modules, a radio modem, a cellular transmission module, or any type of module configured to exchange communications in one of the following formats: GSM or GPRS, CDMA, EDGE or EGPRS, EV-DO or EVDO, UMTS, or IP.

The network module 114 also can be a wired communication module configured to exchange communications over the network 105 using a wired connection. For instance, the network module 114 can be a modem, a network interface card, or another type of network interface device. The network module 114 can be an Ethernet network card configured to enable the thermostat control unit 110 to communicate over a local area network and/or the Internet. The network module 114 also can be a voiceband modem configured to enable the alarm panel to communicate over the telephone lines of Plain Old Telephone Systems (POTS). In some implementations, the alarm panel can be a broadband or cellular gateway where the network module 114 can enable the thermostat control unit 110 to communicate over the network 105.

The control system that includes the thermostat control unit 110 communicates with modules 120 and 130 to perform dynamic environmental control at the property. The module 120 is connected to a thermostat, is configured to monitor temperature and/or energy consumption of an HVAC system associated with the thermostat, and is further configured to provide control of the thermostat. In some implementations, the module 120 can additionally or alternatively receive data relating to activity at a property and/or environmental data at a property, e.g., at various locations indoors and outdoors at the property. The module 120 can directly measure energy consumption of the HVAC system associated with the thermostat, or can estimate energy consumption of the HVAC system associated with the thermostat, for example, based on detected usage of one or more components of the HVAC system associated with the thermostat. The module 120 can communicate temperature and/or energy monitoring information to or from the thermostat control unit 110 and can control the thermostat based on commands received from the thermostat control unit 110.

In some implementations, the module 120 associated with the dynamically programmable thermostat can be integrated with the thermostat control unit 110. For example, the dynamically programmable thermostat can include the thermostat control unit 110, e.g., as an internal component to the dynamically programmable thermostat. In addition, the thermostat control unit 110 can be a gateway device that communicates with the module 120 associated with the dynamically programmable thermostat.

The module 122 is connected to one or more components of an HVAC system associated with a property, and is configured to control operation of the one or more components of the HVAC system. In some implementations, the module 122 is also configured to monitor energy consumption of the HVAC system components, for example, by directly measuring the energy consumption of the HVAC system components or by estimating the energy usage of the one or more HVAC system components based on detecting usage of components of the HVAC system. The module 122 can communicate energy monitoring information and the state of the HVAC system components to the module 120 associated with the thermostat and can control the one or more components of the HVAC system based on commands received from the module 120 associated with the thermostat.

The module 130 is connected to one or more sensors configured to monitor activity within the property and the environment at the property at various locations, e.g., at various indoor and outdoor locations at the property. For example, the sensors connected to the module 130 can include environmental sensors, such as temperature sensors, humidity sensors, noise sensors, light sensors, air quality sensors, smoke detectors, carbon monoxide detectors, water sensors, rain sensors, wind sensors, etc. The sensors can further include sensors for monitoring activity at the property, such as one or more motion sensors, contact sensors, etc. The module 130 connected to the one or more sensors can communicate data obtained by the sensors to the thermostat control unit 110. For example, the module 130 can transmit sensor data indicating activity within the property and data indicating environmental conditions at various locations within the property, e.g., a temperature and humidity in each room of a home, to the thermostat control unit 110.

The modules 120 and 130 can communicate with the controller 112 over communications links 124 and 128, and module 122 can communicate with the module 120 over communication link 126. The communication links 124, 126, and 128 can be wired or wireless data pathways configured to transmit signals from the modules 120, 130 to the controller 112 and from the module 122 to the module 120. The modules 120, 122, and 130 can continuously transmit sensed values to the controller 112, can periodically transmit sensed values to the controller 112, or can transmit sensed values to the controller 112 in response to a change in a sensed value.

In some implementations, the module 122 associated with one or more components of an HVAC system can communicate directly with the thermostat control unit 110. For example, the thermostat control unit 110 can communicate with the module 122 to send and/or receive information related to controlling the components of the HVAC system components, information relating to the energy usage of the HVAC system components, or other information. In some instances, the module 120 associated with the thermostat can communicate information to the thermostat control unit 110, and the thermostat control unit 110 can communicate the information received from the module 120 to the module 122 associated with the one or more HVAC system components.

The application server 160 is an electronic device configured to provide control services by exchanging electronic communications with the thermostat control unit 110 and the one or more mobile devices 140, 150 over the network 105. For example, the application server 160 can be configured to monitor data obtained by the thermostat control unit 110. In this example, the application server 160 can exchange electronic communications with the network module 114 included in the thermostat control unit 110 to send and/or receive information regarding activity at the property and/or the environment at the property. The application server 160 also can receive information regarding activity within or external to the property from the one or more mobile devices 140, 150. For example, the application server 160 can receive information from the one or more mobile devices 140, 150 that indicates the locations of the one or more mobile devices 140, 150.

In some implementations, the application server 160 has access to weather data and/or weather forecast data, where the weather and/or weather forecast data can be used to perform dynamic environmental control within the property. For example, the application server 160 can be connected to the Internet over the network 105 and can access the weather and/or weather forecast data at a website or database that is accessible on the Internet. The weather data can include current weather data, such as a current temperature, humidity, dew point, wind chill, heat index, etc., and the weather forecast data can include short and long term weather forecasts, for example, short and long term temperature forecasts, precipitation forecasts, etc.

The application server 160 can store data, e.g., activity, environmental, and/or weather data, received from the thermostat control unit 110, the mobile devices 140, 150, and/or the Internet, and can perform analysis of the stored data. Based on the analysis, the application server 160 can communicate with and control aspects of the thermostat control unit 110.

The one or more mobile devices 140, 150 are devices that host one or more native applications, e.g., the native applications 142, 152. The one or more mobile devices 140, 150 can be cellular phones or non-cellular locally networked devices. The one or more mobile devices 140, 150 can include a cell phone, a smart phone, a tablet PC, a personal digital assistant ("PDA"), or any other portable device configured to communicate over a network. For example, implementations also can include Blackberry-type devices, e.g., as provided by Research in Motion, electronic organizers, iPhone-type devices, e.g., as provided by Apple, iPod devices, e.g., as provided by Apple, or other portable music players, other communication devices, and handheld or portable electronic devices for gaming, communications, and/or data organization. The one or more mobile devices 140, 150 can be the same or can include mobile devices of different types. The one or more mobile devices 140, 150 can perform functions unrelated to the control system, such as placing personal telephone calls, playing music, playing video, displaying pictures, browsing the Internet, maintaining an electronic calendar, etc.

In some implementations, the one or more mobile devices 140, 150 communicate with and receive control system data from the thermostat control unit 110 using the communication link 138. For instance, the one or more mobile devices 140, 150 can communicate with the thermostat control unit 110 using various local wireless protocols, such as Wi-Fi, Bluetooth, Z-Wave, ZigBee, HomePlug (Ethernet over powerline), or wired protocols such as Ethernet, USB, and other wired protocols based on the RS232, RS485, and/or RS422 standards. The one or more mobile devices 140, 150 can connect locally to the control system and its sensors and other devices. The local connection can improve the speed of communications because communicating through the network 105 with a remote server, e.g., the application server 160, can be slower.

Although the one or more mobile devices 140, 150 are shown communicating with the thermostat control unit 110, the one or more mobile devices 140, 150 can communicate directly with the sensors and other devices controlled by the thermostat control unit 110. In some implementations, the one or more mobile devices 140, 150 replace the thermostat control unit 110 and perform the functions of the thermostat control unit 110 for local control and long range or offsite communication.

In other implementations, the one or more mobile devices 140, 150 receive control system data captured by the thermostat control unit 110 through the network 105. The one or more mobile devices 140, 150 can receive the data from the thermostat control unit 110 through the network 105 or the application server 110 and can relay data received from the thermostat control unit 110 to the one or more mobile devices 140, 150 through the network 105. In this regard, the application server 160 can facilitate communications between the one or more mobile devices 140, 150 and the thermostat control unit 110.

Although the one or more mobile devices 140, 150 are shown in FIG. 1 as being connected to the network 105, in some implementations, the one or more mobile devices 140, 150 are not connected to the network 105. In these implementations, the one or more mobile devices 140, 150 communicate directly with one or more of the control system components and no network connection, e.g., connection to the Internet, or reliance on remote servers is needed.

In some implementations the one or more mobile devices 140, 150 are used in conjunction with only local sensors and/or local devices at a property. In these implementations, the control system 100 only includes the one or more mobile devices 140, 150 and the modules 120, 122, and 130. The one or more mobile devices 140, 150 can receive data directly from the modules 120, 122, and 130 and send data directly to the modules 120, 122, and 130. The one or more mobile devices 140, 150 provide the appropriate interfaces/processing to provide control information, modify settings, control the thermostat, control HVAC system component operations, etc. In some implementations, the one or more mobile devices 140, 150 communicate directly with only the module 120 associated with the thermostat and the module 130 associated with the sensors, and the module 120 communicates with the module 122 associated with the HVAC system components to control operation of the HVAC system associated with the property.

In some implementations, a mobile device 140, 150 is able to determine a geographic location associated with the mobile device 140, 150, and can communicate information identifying a geographic location associated with the mobile device 140, 150. For example, a mobile device 140, 150 can determine the current geographic location of the mobile device 140, 150 by using global positioning system (GPS) capabilities. In other implementations, a geographic location associated with a mobiles device 140, 150 can be determined using other methods, for example, by using Wi-Fi access point triangulation data, cellular network triangulation data, or IP address information, when the mobile device 140, 150 has network connectivity. The mobile device 140, 150 can transmit data identifying the geographic location of the mobile device 140, 150 over the network 105 to the application server 160, or to the thermostat control unit 110.

The one or more mobile devices 140, 150 can each include a native application 142, 152, respectively. The native application 142, 152 refers to a software/firmware program running on the corresponding mobile devices that enables the features below. The one or more mobile devices 140, 150 can load or install the native application 142, 152 based on data received over a network or data received from local media. The native monitoring application 142, 152 can run on mobile devices' platforms, such as Apple iOS, iPhone, iPod touch, Blackberry, Google Android, Windows Mobile, etc.

The native application identifies a geographic location associated with the mobile device 142, 152 and communicates information identifying the geographic location. For example, a mobile device 140, 150 having the native application 142, 152 can determine a geographic location of the mobile device 140, 150 using GPS capabilities, and can communicate data identifying the geographic location to the application server 160. In some instances, the native application 142, 152 can check the location of the mobile device 140, 150 periodically and can automatically detect when a user associated with the mobile device 140, 150 is going toward or away from a property.

In some implementations, the control system enables dynamic environmental control within a property by analyzing activity data, environmental data, and/or weather data, and controlling a thermostat associated with a property's HVAC system based on the analysis. For example, the control system can enable the dynamic control of temperature and humidity within a home based on an analysis of activity data, environmental data, and/or weather data. In some instances, the activity data, environmental data, and/or weather data can be analyzed at the thermostat control unit 110 and, based on the analysis, the thermostat control unit 110 can communicate with the module 120 to control the thermostat and/or the HVAC system associated with the thermostat to dynamically control the environment within the property.

In some examples, activity data includes data indicating the activity of users within a property as well as data indicating the activity of users external to a property. User activity within a property can be detected by one or more sensors associated with the module 130 that are associated with the property, such as one or more motion, contact, noise or other sensors capable of detecting user activity in specific parts of the property. For example, a property can be equipped with a motion sensor in each room of the property, and the control system can determine whether users are located in particular rooms of the property based on data from the motion sensors. In some instances, user activity external to a property is achieved by tracking the locations of mobile devices 140, 150 associated with users of the property. For example, the GPS coordinates of a user's mobile device can be tracked over time and analyzed to determine control of the HVAC system associated with the property. In some instances, tracking a user's mobile device can be used to determine whether the user is leaving or about to arrive at the property, and the fact that the user is leaving or about to arrive can be used to control the HVAC system associated with the property.

Figure 2:
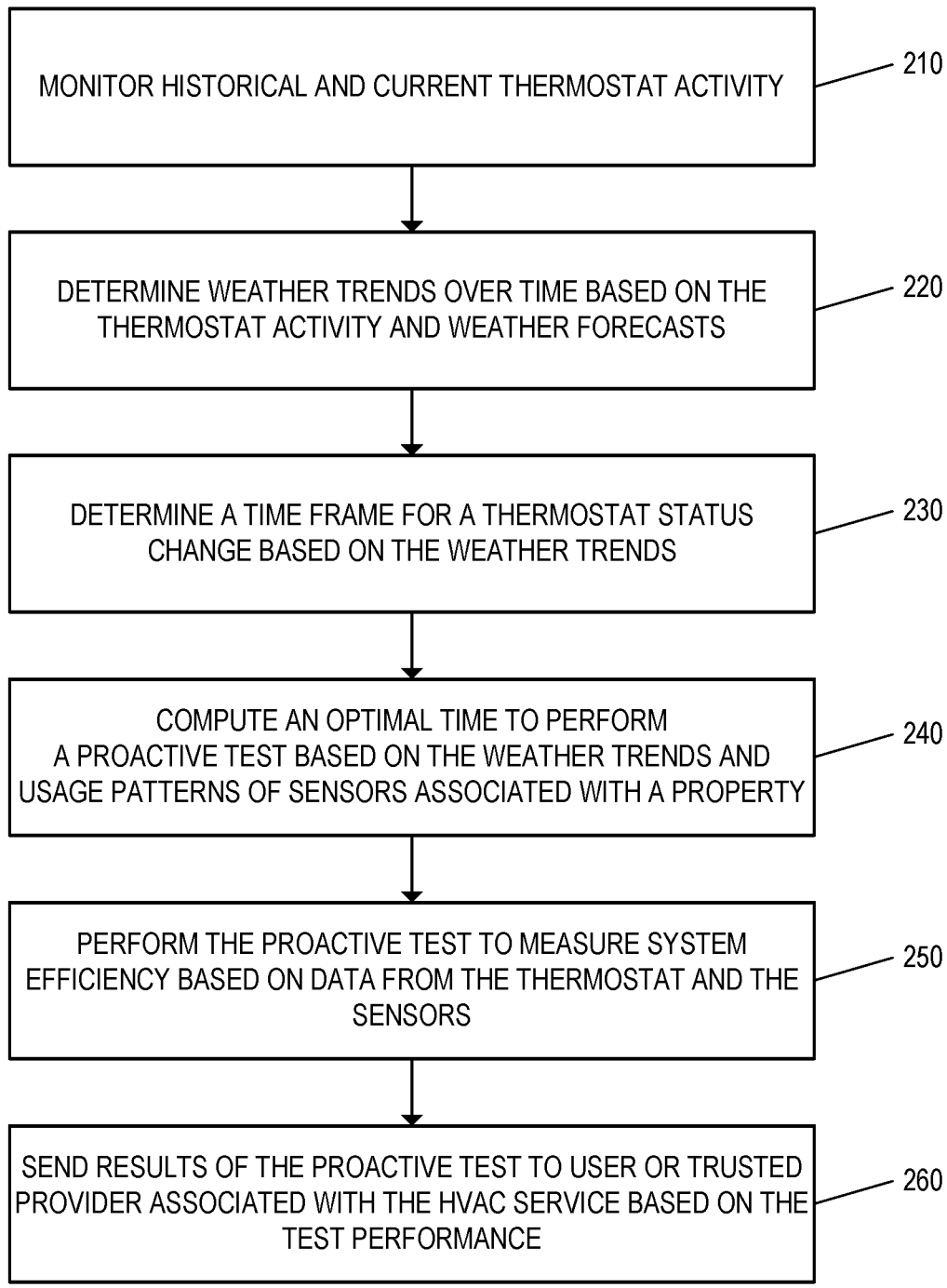
FIG. 2 illustrates an example of a process for determining a thermostat status change and performing proactive tests in response to the status change.

FIG. 2 illustrates an example process 200 for determining a thermostat status change and performing proactive tests in response to the status change. The operations of the example process 200 are described generally as being performed by the system 100. The operations of the example process 200 may be performed by one of the components of the system 100 (e.g., the application server 160) or may be performed by any combination of the components of the system 100. In some implementations, operations of the example process 200 may be performed by one or more processors included in one or more electronic devices.

System 100 monitors historical and current thermostat activity (210). For example, the system 100 may monitor the record of prior thermostat activity for time points for different modes when the HVAC system was last used, such as when the system 100 was last used for heating, when the system 100 was last used for cooling, when the system 100 was used in Auto mode, when the system 100 was used in Fan Only mode, etc. The system 100 also may monitor current thermostat activity, such as ambient temperature, the high and low temperatures of the local weather, and chances of precipitation. In these examples, system 100 may track and store such values over time to generate a log of thermostat activity within the property, as well as time of various events within the property.

The system 100 determines the weather trends over time based on the thermostat activity and weather forecasts (220). For instance, the system 100 may analyze the status of the thermostat activity log to identify and track certain patterns that are associated with usage. For example, the system 100 may analyze mode switches between cooling and heating in relation to the corresponding ambient temperature to determine ideal temperature settings to satisfy user requirements.

In addition, the system 100 may use local weather forecasts within the property's zip code to predict changes in user requirements based on the thermostat activity log. For example, if the weather forecasts suggest a cold front is moving into the location of the property, the system 100 may determine, based on the user's increased use of the heating settings that the user's temperature has increased in response to the cold front. Also, the system 100 may utilize local weather trends to determine a seasonal directional shift that may potentially impact the user's requirements in the near future. For example, if average daily temperature consistently decreases over a monthly period, the system 100 may calculate the rate of daily decrease in temperature to determine, based on the thermostat activity log, whether the user would utilize the system 100 in certain ways (e.g., increasing the temperature setting by 3-4 degrees in response to a 2-3 degree daily decrease in ambient temperature).

The system 100 determines a time frame for thermostat status change based on the weather trends (230). For example, the system 100 may determine when the HVAC system will change its mode of operation based on changes in ambient temperature and user requirements for temperatures within the property. The mode of operation may include a change from cooling to heating, or vice versa. The change in mode of operation also may be related to a change in severity of a setting (e.g., mild heating to moderate or high heating, and vice versa). In such examples, the system 100 may perform a trend analysis to determine a time frame when the change in mode of operation may sufficiently impact system performance to indicate a thermostat status change. For instance, as a result of greater decrease in daily temperature during the transition from autumn to winter, the change in user requirements for temperature within the property may increase to a point where the user stops using the cooling mode and switches to exclusively using the heating mode. In such an instance, the system 100 would determine a time frame for such a switch prior to the subsequent change in mode of operation. This allows the system 100 to automatically set up a proactive test prior to the thermostat status change to ensure that individual components are capable of supporting the change in mode of operation.

The system 100 computes an optimal time to perform a proactive test based on the weather trends and usage patterns of sensors associated with a property (240). For example, the system 100 may look for times when the property is unoccupied or the costs of running the test are modest. The system 100 may determine the property is unoccupied by tracking the patterns of sensors located within the property, such as whether lights are turned on and off, whether motions sensors on doors indicate that the doors and windows are open or closed, and when the last thermostat mode setting was switched. The system 100 also may monitor the status of all of the devices associated with the property capable of being monitored by the system 100 by tracking the operational status of devices. The system 100 may track and store status values over time to generate a log of device operation within the property. The system 100 may analyze the log to assess overall device usage within the property as well as timing of various status events for the devices. The system 100 also may calculate the costs of performing a proactive test by comparing the ambient weather conditions with the thermostat settings within the property. For example, if the thermostat is set to 85 F when the ambient temperature outside the property is 75 F, then the system 100 would determine that the energy requirements to conduct the test would be too high to efficiently perform the proactive test. The system 100 also may monitor the energy consumption within the property to determine if it would be an optimal time to perform the proactive test. For example, the system 100 may use the activity logs of connected appliances to determine whether usage is too high to perform a proactive test.

The system 100 performs the proactive test to measure system efficiency based on data from the thermostat and the sensors (250). For instance, the system 100 computes system efficiency for several (e.g., many) data parameters and determines how the performance compares to one or more target values based on an aggregation of tests previously performed on properties with similar configurations and settings. The group of data parameters may include all properties managed by a monitoring company or a subset of properties managed by different monitoring companies (e.g., electricity, heating, gas, etc.). The system 100 may measure the data parameters by monitoring external sensors, such as humidity sensors, temperature sensors, or from the HVAC system itself. The system 100 performs a calculation based on all of the measurements to determine a computed efficiency score. For example, the system 100 may measure the in-door temperature and humidity, compare the measured values to the actual values, and calculate the efficiency score how each individual measurement performed relative to the target value for each measurement.

The system 100 sends results of the proactive test to the user or a trusted provider associated with the HVAC service based on the performance (260). For example, once the proactive test is complete, the system 100 sends a notification to a user that an automated test has been performed and requires further attention to fix appropriate issues to ensure the HVAC system functions properly during a subsequent thermostat status change. The system 100 may handle the results of the test differently based on the results and the urgency of the service required. For example, the system 100 may send a simple notification to the user if the results indicate that the performance was better than a threshold efficiency score that indicates strong overall performance. However, if the efficiency score indicates the performance was acceptable or below the threshold, the system 100 may send iterative notifications to the user to induce action to schedule a maintenance request. If the efficiency score indicates that the performance was significantly below the threshold efficiency score or the system 100 was unable to complete the proactive test due to a component failure, the system 100 may send an urgent notification to the user as well as the service provider so that the likelihood of scheduling a service request is prioritized.

In some implementations, the notification sent to the user in response to a proactive test may include an on-screen direction on the thermostat interface where the user adjusts the settings. For example, the system 100 may present an on-screen text message indicating that the test was performed by the system 100 and that further action is required to fix specific issues with certain components of the system 100. In other implementations, the notification may include a text notification transmitted to another device connected to the same network as the thermostat. For example, the notification may be a text message sent to the user's mobile device through a mobile application that connects the mobile device to the thermostat through a network interface. In other examples, the notification may be to the user through a cloud network that manages the consumer service account and allows the user to take actions, such as pay monthly bills, update account information, and initiate service requests.

In some examples, the results of the proactive test may be sent directly to a third-party service provider or the HVAC system manufacturer. For example, upon determining that the efficiency score is below the threshold efficiency score, the system 100 may transmit an electronic message through a network to a monitoring application server that handles all incoming and outgoing messages to a service provider's systems. In these examples, the indication that the efficiency score was below the threshold efficiency score may be communicated through a service report that includes relevant information for a service representative to determine the appropriate action to be taken. In response to receiving the service report, the third-party service provider or the thermostat manufacturer may initiate contact with the user to inform the user of the results of the proactive test and schedule a service appointment to perform system maintenance.

In some implementations, the system 100 may prepare an executive dashboard summarizing the data parameter measurements that are included in the efficiency score and provide relevant trend analysis over a certain period of time to help the service providers to determine the exact nature of the issue for the test failure. For example, the executive dashboard may represent visualizations of activity logs of the thermostat in addition to results of the test to provide a historical analysis of system performance. The executive dashboard also may include a history of prior completed service requests to show whether the issue that caused the test failure was related to a prior service issue encountered by the system 100.

Figure 3:
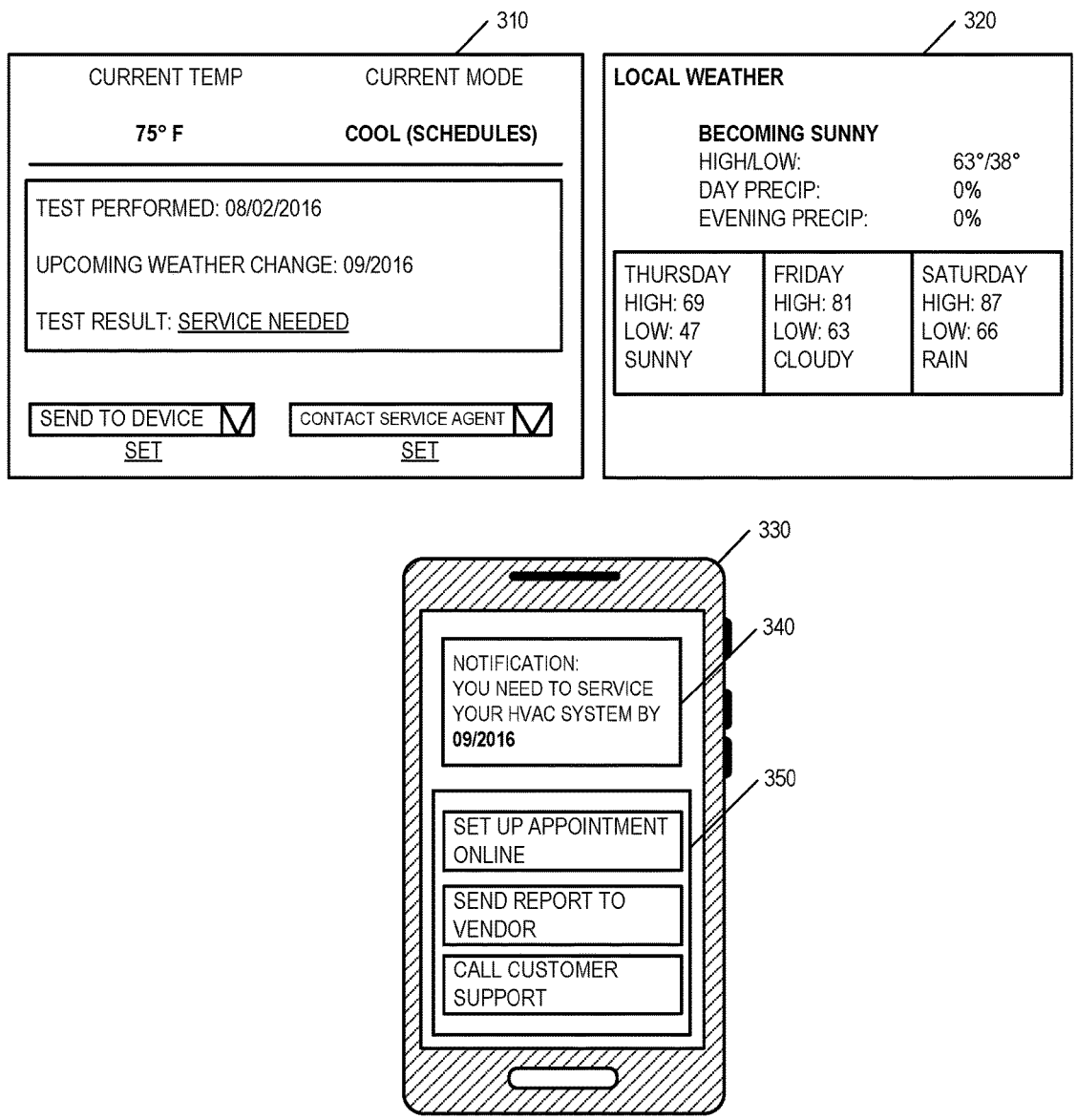
FIG. 3 illustrates example interfaces for presenting and sending information related to performing a proactive test.

FIG. 3 illustrates example interfaces for presenting and sending information related to performing a proactive test. The interface 300 may be presented over a network (e.g., as a webpage on a personal computer) or may be displayed by an application that operates on a device (e.g., displayed by a native monitoring application on a mobile device). The interface 300 includes a thermostat area 310. The area 310 displays a current temperature measured by the thermostat, a current mode set for the thermostat, and an indication of when the last proactive test was performed. The area 310 also includes an upcoming weather change date determined by system 100 that corresponds to a time when a thermostat status change is expected to occur based on current weather trends and past thermostat activity. The area 310 further includes the result of the proactive test and a user recommendation based on the result, as well as actions available to the user. In addition, the interface 300 includes a weather area 320 that displays a forecast of the current local weather at the property being monitored.

After the system 100 performs a proactive test, a text message is shown on area 310 indicating when the test was performed and the results of the test. The content of the message varies based on the results of the proactive test. For example, as shown, if the results indicate that the system 100 requires immediate assistance, the area 310 may indicate 'SERVICE REQUIRED' to inform the user of the immediate need to schedule a service appointment. The area 310 also may display potential actions to the user to take based on the test results. For example, as shown, the user may send the alert to a secondary device, such as a mobile device 330 or any other device that is connected to the thermostat through a network connection. Additionally, the user may have the option to send the relevant test information directly to the thermostat service provider to set up a service appointment.

In some implementations, the results of the proactive test are directly transmitted to a user device that is connected to the thermostat and the system 100 through a network connection. For example, mobile device 330 may receive a notification 340 indicating that a proactive test has been performed and that further action needs to be taken prior the date of an upcoming weather change. In some instances, the notification 340 may be sent to mobile device 330 through a native monitoring application used by the system 100. In addition, the notification 340 may be sent to the mobile device as text notification through a cellular connection. The user also may be presented with options 350 in response to the notification 340. Examples of options 350 include setting up an online appointment through a cloud account, sending an electronic report to a vendor, or calling customer support to schedule a service appointment as represented in FIG. 3.

Figure 4:
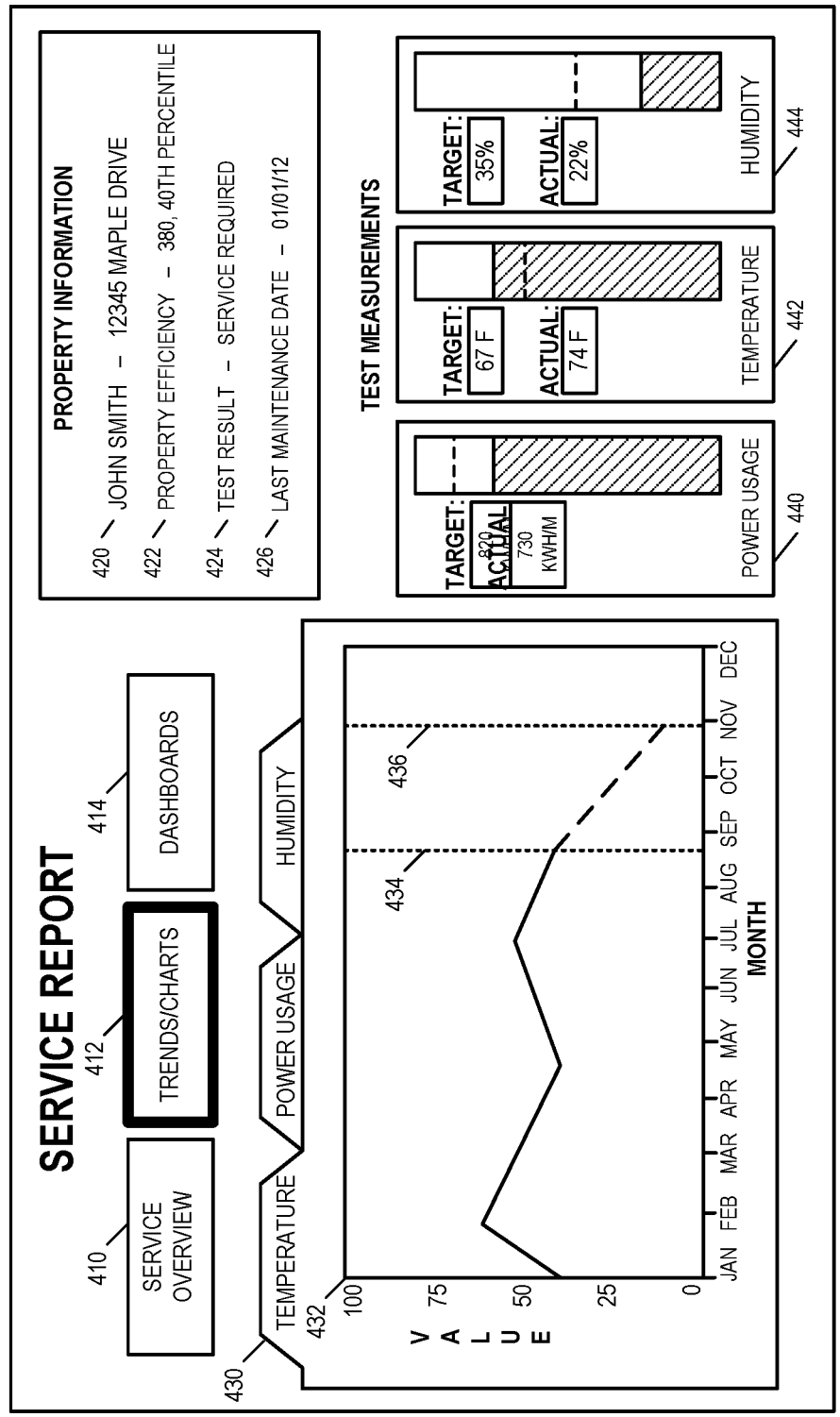
FIG. 4 illustrates an example report for sending the results of a proactive test.

FIG. 4 illustrates an example report 400 for sending the results of a proactive test. The report 400 may be presented over a network (e.g., as a webpage on a personal computer) or may be displayed by an application that operates on a device (e.g., displayed by a native monitoring application on a mobile device). The report 400 includes different visualization options for an end-user, such as service tab 410, trends/charts tab 412, and dashboards tab 414. The report also presents aggregate test results from the proactive test performed by the system 100 prior to a weather change event.

The report 400 also shows relevant property information such as the identification information 420 that identifies a user and an address of the property associated with report 400. The report 400 also includes property efficiency score 422. The property efficiency score 422 indicates how well the property makes use of energy, heating and cooling functions to meet user requirements for ambient temperature. The property efficiency score 422 is calculated based on an aggregation of test measurements, such as power usage, temperature and humidity, among others. The property efficiency score 422 includes a numeric score and a percentile. As shown, property efficiency score 422 indicates a score of 380 (out of 1000) that puts the property in the fortieth percentile for property efficiency of similar properties. The report also shows test results 424 that indicate a service status based on comparing the numerical score of the property efficiency score 422 to specified thresholds. As shown, the test result 424 indicates that the property requires service based on its property efficiency score 422 being within the fortieth percentile for property efficiency. The test result 424 also may indicate other statuses, such as 'Service Recommended' and 'No Service Needed' for higher property efficiencies. The report 400 also includes a last maintenance date 426 which indicates when the property last received service.

The report 400 further includes tabbed views of and corresponding sections for different visualizations of aggregate data measured by the proactive test. As shown, the report 400 may include a service overview tab 410, a trends/charts tab 412 and a dashboards tab 414. The service overview tab 410 shows prior history of all service requests and a summary of the issues and the maintenance procedures performed during each request. The dashboards 414 shows values of key metrics related to general equipment of the HVAC system. For example, the dashboard may show outside temperature, inside temperature, average temperature, ventilation, and humidity for the property. The report 400 also includes a trends/charts tab 412 that shows key test measurements over a certain period of time. For example, as shown, chart 430 may include temperature measurements for a calendar year for the property. The chart demonstrates fluctuations in prior measurements and also may include projections for future months based on prior monthly trends. As shown, the report 400 may project a decrease in temperature within the period between projected timeline 434 and projected timeline 436 based on a combination of local weather forecasts and annual measurements.

In some implementations, the projected timelines 434 and 436 may indicate a predicted time period for a subsequent weather pattern change based on thermostat activity and weather forecasts. In such examples, the chart 430 may be used to represent a potential thermostat status change to show an end-user the performance impact of the determined thermostat status change on the test measurements. Projected timelines 434 and 436 may change based on the determination of the weather pattern change as well as the current thermostat activity within the system 100. In other examples, the report 100 may indicate more than two projected timelines to indicate reoccurring weather pattern changes corresponding to annual seasonal changes in weather.

The chart 430 also includes different tabs for other test measurements that are calculated by the proactive test. As shown, the chart 430 may show power usage and system humidity over a period of time. In some implementations, the time period may be adjustable to demonstrate more time-specific trends. For example, an end-user may have the ability to adjust the time period shown from a yearly period to a daily or weekly period to see usage trends by the user that also may indicate reasons projected performance decreases and current test measurements. An end-user also may combine the tabs of the different test measurements to simultaneously analyze multiple trends for different test measurements to understand the impacts and connections between more significant performance issues. For example, a user may combine the visualizations for temperature and power usage to determine whether an increase in temperature settings leads to a subsequent excessive increase in power usage to determine that the system is functioning inefficiently.

The report 400 also includes graphics for actual values of test measurements compared to target values based on similar properties. For example, as shown, the report 400 may include a graphic 440 that shows power usage, a graphic 442 that shows temperature, and a graphic 444 that shows humidity. The graphic 440 may show the measured monthly power usage for the property that when the proactive test was performed. For example, as shown the measured power usage is 720 kWh/m compared to a target power consumption of 820 kWh/m based on similar properties. The graphic 440 may show a visualization that represents the measured value to the actual value on a bar graph to show the end-user how the test measurements compare to target measurements. The power consumption may be measured by calculating the power wattage of all appliance devices multiplied by the time of usage for a month time frame. The graphic 442 may show the measured average ambient temperature within the property based on thermostat activity and the local weather patterns. As shown, the target average ambient temperature is 67 Fahrenheit whereas the actual ambient temperature is 74 F. The average ambient temperature may be measured by recording thermostat temperature values over a certain time frame and calculating the mean value over the previous month from when the proactive test is performed. Finally, the graphic 444 may show the measured average humidity levels based on the heating and cooling settings of the thermostat. As shown, the target average humidity level is 35% whereas the actual measured humidity level is 22%. The humidity level may be measured using a vapor sensor within the property that measures the actual amount of water vapor within the specified volume of air within the property.

In some implementations, the end-user of the report 400 may be a direct service provider of the property that receives the report automatically after the proactive test results indicate that the system 100 requires maintenance. In this instance, the user need not take any further action to schedule a service appointment as the service provider, upon receiving the report 400 with the property information, contacts the user to schedule a service appointment to conduct maintenance of the system 100 or notifies the user that a service appointment has been automatically scheduled. In some implementations, the end-user of the report 400 is a third-party vendor of the thermostat or HVAC equipment that monitors user experience and service requests. Upon receiving the report 400, the vendor then may contact a local service provider nearby the property location to schedule a service appointment. In some examples, the end-user may be the property owner who accesses the service report on a web-based portal that shows all account details and activity. In such examples, the user may schedule the service appointment through an online customer service portal with a unique report ID provided by the report 400.

Figure 5:
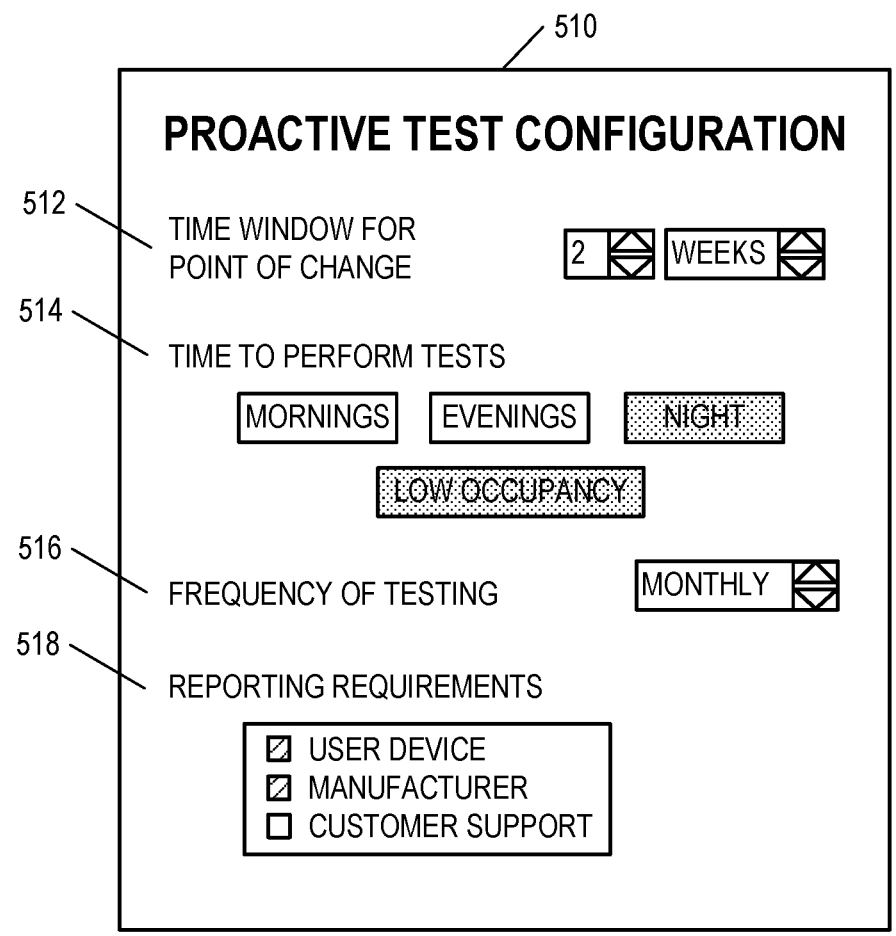
FIG. 5 illustrates an example of a user interface for configuring proactive test parameters

FIG. 5 illustrates an example of a user interface 500 for configuring proactive test parameters. In general, the user interface 500 can be provided to a user to configure how the system 100 performs proactive tests on appliances within the property such as the HVAC components 122. As depicted, the interface 500 may include a setting 512 for adjusting the time window for a point of change, a setting 514 to specify a time to perform proactive tests, a setting 516 to specify the frequency of testing, and a setting 518 for specifying reporting requirements. In this regard, a user may adjust one or more settings 512-518 in order to change the configuration of the system 100.

The setting 512 provides a user with the ability to adjust the time window for a detected point of change in operation of an appliance such as one of the HVAC components 122. As described previously, the point of change in operation can be from a cooling setting to a heating setting based on a change in seasonal weather patterns (e.g., decrease in ambient temperature). In this instance, the setting 512 enables the user to adjust the sensitivity of the system 100 in detecting a point of change in operation. For example, if the time period in the setting 512 is adjusted to 2 months, then the system 100 is configured to identify long-term usage patterns that vary on a monthly basis (e.g., changes in interior set point temperature in relation to changes in outdoor temperatures). Alternatively, if the time period in the setting 512 is adjusted to 2 days, then the system 100 is configured to identify short-term usage patterns that vary on a daily basis (e.g., hourly changes in set point temperature in relation to time of day). In this regard, the specification of the time window can be used to adjust the scope of proactive testing of the usage data detected by the sensors 130 and the thermostat 120.

The setting 514 enables a user to specify preferred time periods to perform proactive tests of the appliance such that there is limited impact to the normal operation of the appliance. For instance, a user can indicate a preference to perform the proactive tests during night time when usage is minimal, or in times of low occupancy determined by data obtained from the sensors 130. In this regard, the system 100 can combine both a set of user-specified preferences and detected data in order to determine the most appropriate time period to perform a proactive test.

The setting 516 enables a user to specify the frequency of proactive testing, which is then used by the system 100 to periodically obtain usage data associated with the appliance, and perform proactive testing based on the information indicated by the usage data. For example, if a user indicates a high frequency of testing (e.g., weekly), the system 100 can then obtain usage data over shorter time periods and more frequently determine usage patterns used to determine a time for operational change of the appliance. Alternatively, if a user indicates a low frequency of testing (e.g., yearly), the system 100 can then obtain usage data over large periods of time and less frequently determine usage patterns used to determine a time for operational change of the appliance. Usage data over larger periods of time can be used to indicate more general usage patterns (e.g., seasonal changes in operation), whereas usage data over shorter periods of time can be used to indicate more frequent usage patterns (e.g., time periods of high usage within a single day).

The reporting requirements 518 enables a user to indicate entities to receive notifications or alerts if the system 100 determines that a proactive test of an appliance requires maintenance. For example, notifications can be provided to user devices (e.g., the mobile devices 140, 150), a manufacturer of the appliance, or a customer support representative associated with a third party organization that provides monitoring services to a property. As described previously, the transmitted notifications can be used to convey performance information from to the proactive tests performed by the system 100. In one example where the proactive test is performed on a HVAC system component 122, the notification provided can indicate a likelihood that the HVAC component will require maintenance based on the usage data obtained from the sensors 130 and the thermostat 120, and a time for operational change of the HVAC system component 122.

Figure 6:
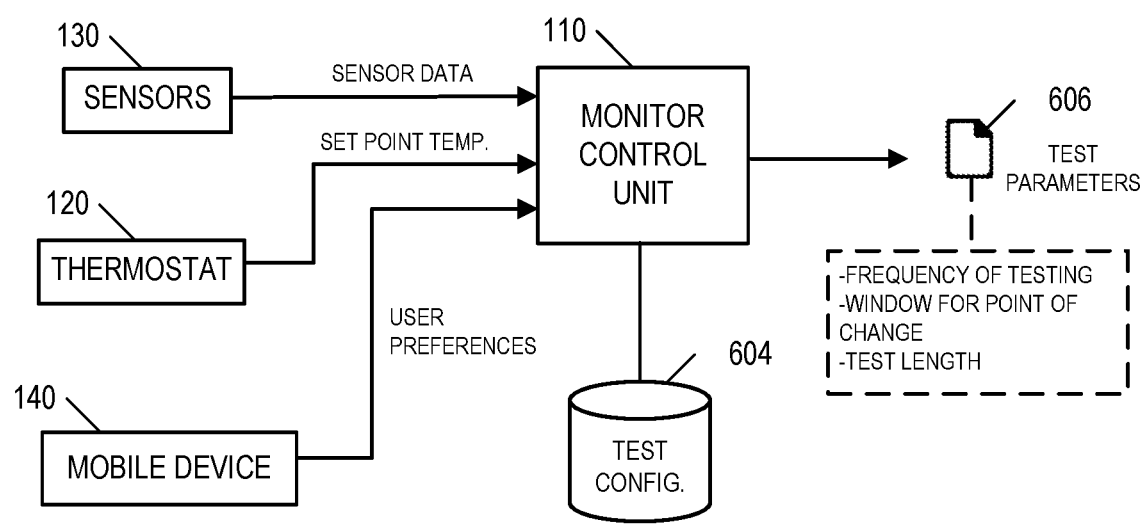
FIG. 6 illustrates an example of a system for generating a proactive test parameters using different types of system data

FIG. 6 illustrates an example of a system 600 for generating a proactive test parameters using different types of system data. As depicted, the monitor control unit may receive sensor data from the sensors 130, set point temperature data from the thermostat 120, and a set of user preferences from the mobile device 140. In some instances, the user preferences correspond to the user-defined settings on the user interface 500. The monitor control unit 110 then generates test parameters 606 based on the received sensor data, set point temperature, the set of user preferences 602, and test configuration 604. In addition, the monitor control unit 110 may also obtain and update stored test configurations 604 based on the received input from the sensors 130, thermostat 120, and the set of user preferences 602.

The test parameters 606 are used to coordinate and/or configure operations related to performing proactive tests of an appliance. For example, as depicted, the test parameters 606 may specify a frequency of testing, a time window for a point of change in operation, and a test length associated with the proactive test. In addition, because the monitor control unit 110 periodically receives input data from the sensors 130, the thermostat 120, and the mobile device 140, the test parameters 606 can be periodically generated to adjust and reconfigure the operations related to the proactive tests. In this regard, the monitor control unit 110 can variably adjust the operations related to proactive tests based on changing conditions and preferences of the user within the property. For instance, if the user preferences are significantly adjusted by a user (e.g., changes to user-defined settings in the interface 500), then the monitor control unit 110 then adjusts the test parameters 606 accordingly to reflect the changes in user preferences. Likewise, if the sensor data indicates smaller deviations in daily temperature outside the property, but greater increases in water consumption (e.g., due to drier weather outside the property), then the monitor control unit 110 can adjust the test parameters 606 to deemphasize proactive testing of heating/cooling components of the HVAC system, but emphasize proactive testing of water system due to the data indicating increased water consumption.

Figure 7:
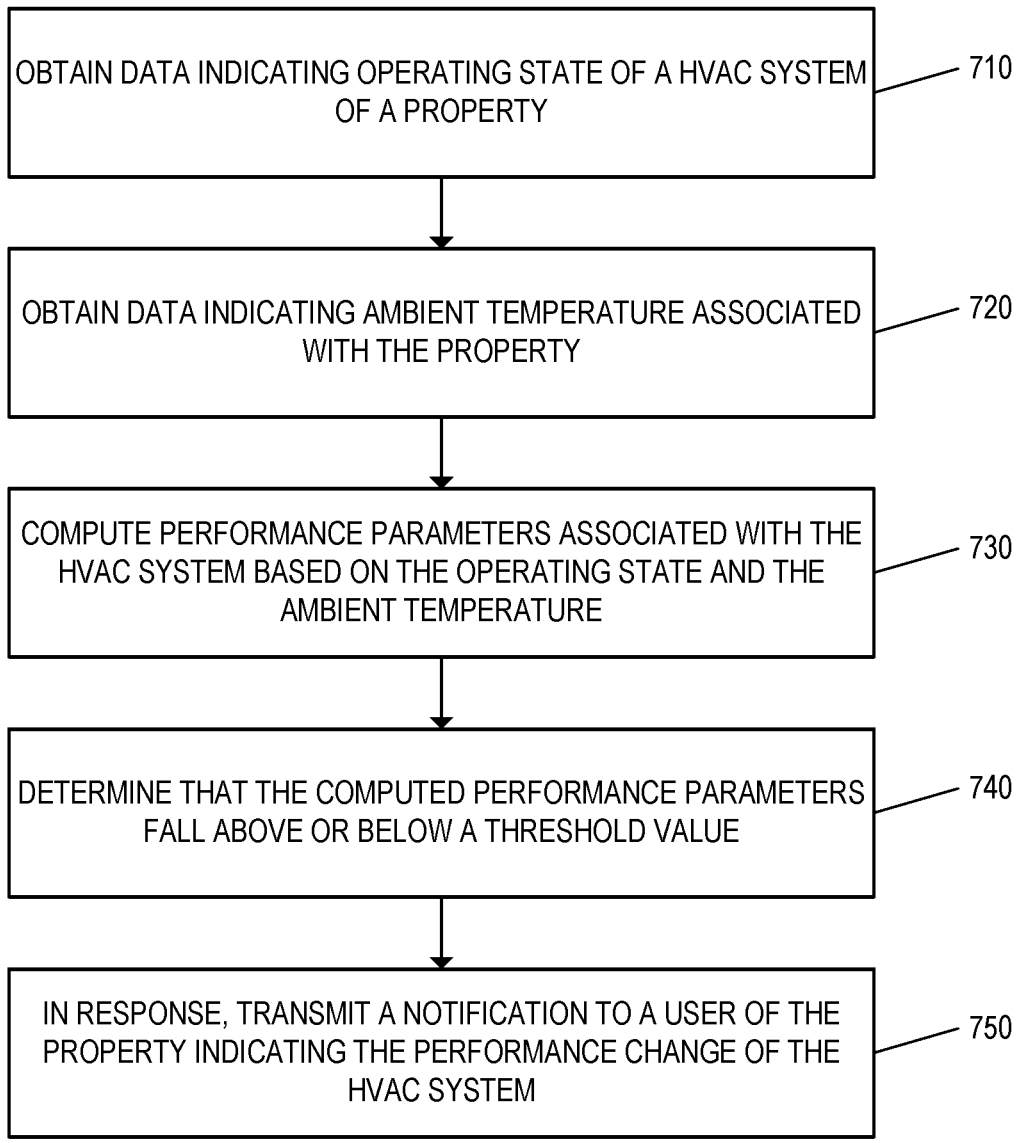
FIG. 7 illustrates an example of a process for transmitting notifications related to changes in system performance.

FIG. 7 illustrates an example of a process 700 for transmitting notifications related to changes in system performance. Briefly, the process 700 may include obtaining data indicating an operating state of a HVAC system of a property (710), obtaining data indicating ambient temperature associated with the property (720), computing performance parameters associated with the HVAC system based on the operating state and the ambient temperature (730), determining that the computed performance parameters fall above or below a threshold value (740), and in response, transmitting a notification to a user of the property indicating the performance change of the HVAC system (750).

In more detail, the process 700 may include obtaining data indicating an operating state of a HVAC system of a property (710). For instance, the monitor control unit 110 may obtain data associated with the HVAC components 122 of a property. The obtained data can include present operating state such as where the components are set to a cooling or heating setting, or an operating schedule (e.g., daily on/off time points). The obtained data can also include historical information associated with the HVAC components 122 over a particular period of time (e.g., over a six-month time period).

The process 700 may include obtaining data indicating ambient temperature associated with the property (720). For instance, the monitor control unit 110 may obtain the user-defined internal set point temperature for the property and a measured ambient temperature within the property. The measured ambient temperature can also be tracked as a function of time.

The process 700 may include computing performance parameters associated with the HVAC system based on the operating state and the ambient temperature (730). For instance, the monitor control unit 110 may initially compute a heating or cooling rate of the HVAC component 122 of the property based on change in the change in ambient temperature over a particular period of time. The monitor control unit 110 then may correlate the computed heating or cooling rate with power measurements associated with the operation of the HVAC component 122 in order to determine a performance metric for the HVAC component 122. For example, the performance metric can be used to indicate the amount of energy utilized by the HVAC component 122 to increase or decrease the ambient temperature by a particular amount (e.g., one degree Fahrenheit) during a heating or cooling operation.

In some implementations, the monitor control unit 110 may additionally or alternative measure the amount of time it takes for the HVAC component 122 to increase or decrease the ambient temperature of the property during a heating or cooling operation. In such implementations, the amount of time measured can be used a performance metric indicating the efficiency of the HVAC component 122 during the heating or cooling operation. For example, smaller amounts of time measured indicate a higher efficiency, whereas larger amounts of time indicate a lower efficiency. In some instances, the monitor control unit 110 may additionally measure a peak performance metric, over a period of time (e.g., a three month period), that corresponds to the highest performance for the HVAC component 122.

The process 700 may include determining that the computed performance parameters fall above or below a threshold value (740). For instance, the monitor control unit 110 may compare the computed performance metrics (e.g., power output necessary to adjust ambient temperature, or time period necessary to adjust the ambient temperature) to threshold values associated with the computed peak performance of the HVAC system 122. If the value of computed performance metrics falls below the corresponding threshold values, then the monitor control unit 110 may determine that the HVAC component 122 is either performing inefficiently, at risk of system failure, and/or requires routine maintenance to prevent a system failure during a time of operational change (e.g., a seasonal change in operation).

The process 700 may include, in response, transmitting a notification to a user of the property indicating the performance change of the HVAC system (750). For instance, in response to determining that the computed performance metrics for the HVAC component 122 is below the corresponding threshold values, the monitor control unit 110 may transmit one or more notifications to a user of the property associated with the HVAC component 122. For example, as depicted in FIG. 3, the system 100 may transmit a notification to a user device such as the mobile devices 140, 150. In some implementations, the notifications may also be transmitted to other entities such as the manufacturer of the HVAC component 122, or a system provider of the system 100 at the property associated with the HVAC component 122. As depicted in FIG. 4, the notification can also include the service report 400 in addition to an indication that the HVAC component 122 requires maintenance.

Figure 8:
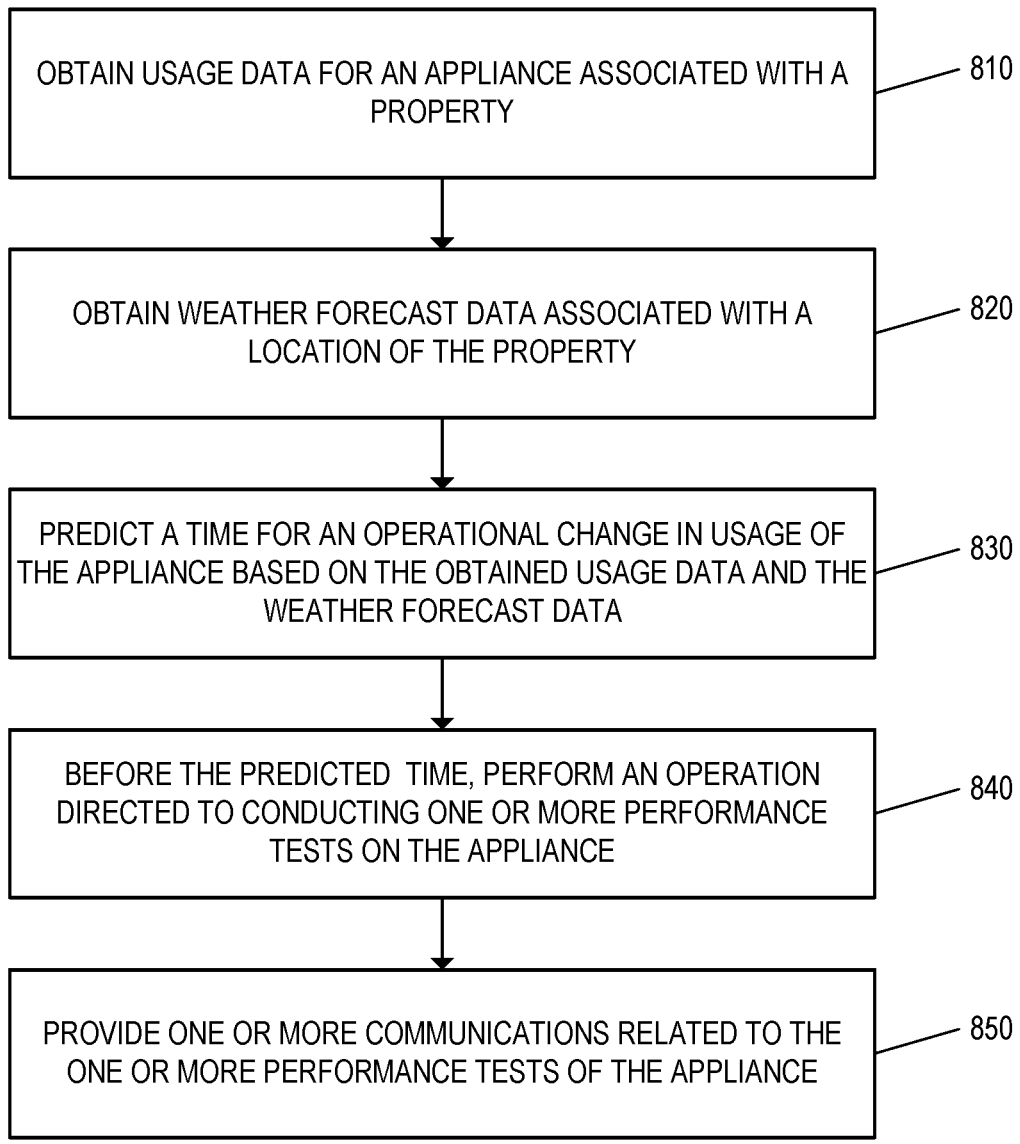
FIG. 8 illustrates an example of a process for performing proactive tests on an appliance before an operational change.

FIG. 8 illustrates an example of a process 800 for performing proactive tests on an appliance before an operational change. Briefly, the process 800 may include obtaining usage data for an appliance associated with a property (810), obtaining weather forecast data associated with a location of the property (820), predicting a time for an operational change in usage of the appliance based on the obtained usage data and the weather forecast data (830), before the predicted time, performing an operation directed to conducting one or more performance tests on the appliance (840), providing one or more communications related to the one or more performance tests of the appliance (850).

In more detail, the process 800 may include obtaining usage data for an appliance associated with a property (810). For instance, the monitor control unit 110 may obtain usage data for the HVAC component 122 associated with a property. As described previously, the obtained usage data may indicate past activity of the HVAC component 122 (e.g., historical data over a particular period), and present operational status of the HVAC component 122 (e.g., a set point temperature of the property, or information indicating whether the HVAC component 122 is presently a configured to operate in a heating or cooling operation).

The process 800 may include obtaining weather forecast data associated with a location of the property (820). For instance, the monitor control unit 110 may obtain weather forecast data associated with a location of the property. As described previously with respect to FIG. 2, the weather data may include subsequent weather patterns at the location, and/or prior weather information over a particular period of time.

The process 800 may include predicting a time for an operational change in usage of the appliance based on the obtained usage data and the weather forecast data (830). For instance, the monitor control unit may predict a time for an operational change in usage of the HVAC component 122 based at least on the obtained user data, and the obtained weather forecast data. As described previously, in some instances, the predicted time for the operational change in usage of the HVAC component 122 may correspond to seasonal changes in operation due to changes in weather patterns at the location of the property. In other instances, the predicted time for the operational change in usage of the HVAC component 122 may be changes in operation based on changes in user preferences or requirements. In these instances, the predicted time is used by the system 100 to identify a time when the HVAC component 122 is particularly susceptible to system failure due to the changes in operation.

The process 800 may include, before the predicted time, performing an operation directed to conducting one or more performance tests on the appliance (840). For instance, before the predicted time for the operational change in usage of the HVAC component 122, the monitor control unit 112 may perform an operation directed to conducting one or more performance tests on the HVAC component 122. As described previously with respect to FIGS. 2 and 4, the performance tests may include comparing the measured power usage, temperature, and humidity of the HVAC component 122 to expected value for the power usage, temperature, and humidity based on user-specified settings on the monitor control unit. In this example, the performance test can be used to indicate whether the HVAC component 122 is underperforming, and therefore susceptible to a system failure at the predicted time for an operational change. In another example described previously with respect to FIG. 7, the performance tests may include measuring the power output or timing information associated with the operation of the HVAC component 122 in relation to changes in ambient temperature during a heating or cooling operation. In this example, if the measured performance metrics fail to satisfy threshold levels of performance, then the monitor control unit 110 may determine that the HVAC component 122 may be susceptible to system failure during a predicted time for an operational change.

The process 800 may include providing one or more communications related to the one or more performance tests of the appliance (850). For instance, as described previously, the monitor control unit 110 or the thermostat application server 160 may generate instructions to transmit one or more notifications related to the performance tests to the mobile devices 140, 150. In some instances, the notifications can include information associated with the performance tests such as the service report 400 as described previously with respect to FIG. 4. In other instances, where the monitor control unit 110 determines that the HVAC component 122 is susceptible to system failure, the notifications can include alerts and/or indications to a user to perform maintenance on the HVAC component 122 before the predicted time for operational change such as the notification 340 as described previously with respect to FIG. 3. In addition, the notifications may also be provided to manufacturers or vendors of the HVAC component 122, or third party service providers that provide monitoring services to a property where the monitor control unit 110 and the HVAC component 122 may be located.

The described systems, methods, and techniques may be implemented in digital electronic circuitry, computer hardware, firmware, software, or in combinations of these elements. Apparatus implementing these techniques can include appropriate input and output devices, a computer processor, and a computer program product tangibly embodied in a machine-readable storage device for execution by a programmable processor. A process implementing these techniques can be performed by a programmable processor executing a program of instructions to perform desired functions by operating on input data and generating appropriate output. The techniques can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as Erasable Programmable Read-Only Memory (EPROM), Electrically Erasable Programmable Read-Only Memory (EEPROM), and flash memory devices; magnetic disks such as internal hard disks and removable disks; magneto-optical disks; and Compact Disc Read-Only Memory (CD-ROM). Any of the foregoing can be supplemented by, or incorporated in, specially designed application-specific integrated circuits (ASICs).

It will be understood that various modifications can be made. For example, other useful implementations could be achieved if steps of the disclosed techniques were performed in a different order and/or if components in the disclosed systems were combined in a different manner and/or replaced or supplemented by other components. Accordingly, other implementations are within the scope of the disclosure.

What is claimed is:

1. An electronic system comprising:
   one or more sensors that are located throughout a property and that are configured to generate sensor data; and
   a control unit that is located in the property and configured to perform operations comprising:
      obtaining, from the one or more sensors, the sensor data for an appliance associated with the property, the obtained sensor data indicating past usage activity patterns of the appliance by users of the property and present operational status of the appliance;
      determining, based on the past usage activity patterns of the appliance, a particular anticipated usage activity pattern of the appliance corresponding to the operational change in usage of the appliance;
      obtaining weather forecast data associated with a location of the property;
      predicting a time for an operational change in usage of the appliance based at least on the particular anticipated usage activity pattern for the appliance and the obtained weather forecast data;
      before the predicted time for the operational change in usage of the appliance:
         identifying one or more performance tests to perform on the appliance based on the past usage activity patterns of the appliance and the particular anticipated usage activity pattern for the appliance;
         determining, based on the past usage activity patterns of the appliance, a time period during which to perform the one or more performance tests, the time period representing times when the appliance is not in use by the users of the property;
         performing, at the time period, an operation directed to conducting one or more performance tests on the appliance based on the one or more identified performance tests; and
      providing, to a client device of a user from among the users of the property, one or more communications corresponding to the one or more performance tests of the appliance based at least on results of the one or more performance tests of the appliance.

2. The system of claim 1, wherein the predicted time for the operational change in usage of the appliance reflects a change in seasonal operation of the appliance.

3. The system of claim 1, wherein the operations comprise:
   determining to perform a maintenance operation on the appliance based at least on performing an operation directed to conducting the one or more performance tests on the appliance; and
   before the predicted time for the operational change in usage of the appliance, transmitting an instruction to the appliance to perform the maintenance operation.

4. The system of claim 1, wherein predicting the time for the operational change in usage of the appliance comprises:

obtaining data associated with a plurality of properties determined to be within a threshold proximity to the property;
identifying a subset of the obtained data that is corresponding to the past activity of the appliance and the present operational status of the appliance; and
predicting a time for an operational change in usage of the appliance based at least on the obtained usage data for the appliance, the obtained weather forecast data, and the subset of the obtained data from the plurality of properties.

5. The system of claim 1, wherein the operations comprise:
providing, to a device associated with a service provider of the property, one or more communications corresponding to the one or more performance tests of the appliance based at least on results of the one or more performance tests of the appliance.

6. The system of claim 1, wherein:
the appliance represents a component of a HVAC system associated with the property, and
the predicted time for the operational change in usage of the appliance reflects a period of time when the component of the HVAC system is configured to be adjusted from either a cooling setting to a heating setting or a heating setting to a cooling setting.

7. The system of claim 6, wherein the obtained usage data for the appliance comprises temperature set point data from a thermostat associated with the HVAC system, energy consumption data associated with the HVAC system, and data indicating presence of individuals within the property.

8. The system of claim 6, wherein the operation directed to conducting one or more performance tests on the appliance comprises:
measuring a power usage, an operating temperature, and a humidity associated with the component of the HVAC system; and
comparing (i) the measured power usage to a target power usage, (ii) the measured operating temperature to a target operating temperature, and (iii) the measured humidity to a target humidity, wherein each of the values of the target power usage, the target operating temperature, and the target humidity are based on one or more user-defined settings of the property.

9. A method performed by a control unit that is located in a property, the method comprising:
obtaining, by the control unit and from the one or more sensors that are located throughout the property and configured to generate sensor data, sensor data for an appliance associated with the property, the obtained sensor data for the appliance indicating past usage activity patterns of the appliance by users of the property and present operational status of the appliance, wherein the control unit is configured to exchange data communications between the one or more sensors, the appliance, a client device of a user from among the users of the property, and a remote server system;
determining, by the control unit and based on the past usage activity patterns of the appliance, a particular anticipated usage activity pattern of the appliance corresponding to the operational change in usage of the appliance;
obtaining, by the control unit, weather forecast data associated with a location of the property;
predicting, by the control unit, a time for an operational change in usage of the appliance based at least on the particular anticipated usage activity pattern for the appliance and the obtained weather forecast data;
before the predicted time for the operational change in usage of the appliance:
identifying, by the control unit, one or more performance tests to perform on the appliance based on the past usage activity patterns of the appliance and the particular anticipated usage activity pattern for the appliance;
determining, by the control unit and based on the past usage activity patterns of the appliance, a time period during which to perform the one or more performance tests, the time period representing times when the appliance is not in use by the users of the property;
performing, by the control unit and at the time period, an operation directed to conducting one or more performance tests on the appliance based on the one or more identified performance tests; and
providing, by the control unit and to the client device of the user from among the users of the property, one or more communications corresponding to the one or more performance tests of the appliance based at least on results of the one or more performance tests of the appliance.

10. The method of claim 9, wherein the predicted time for the operational change in usage of the appliance reflects a change in seasonal operation of the appliance.

11. The method of claim 9, comprising:
determining, by the control unit, to perform a maintenance operation on the appliance based at least on performing an operation directed to conducting the one or more performance tests on the appliance; and
before the predicted time for the operational change in usage of the appliance, transmitting, by the control unit, an instruction to the appliance to perform the maintenance operation.

12. The method of claim 9, wherein predicting the time for the operational change in usage of the appliance comprises:
obtaining data associated with a plurality of properties determined to be within a threshold proximity to the property;
identifying a subset of the obtained data that corresponds to the past activity of the appliance and the present operational status of the appliance; and
predicting a time for an operational change in usage of the appliance based at least on the obtained usage data for the appliance, the obtained weather forecast data, and the subset of the obtained data from the plurality of properties.

13. The method of claim 9, comprising:
providing, by the control unit and to a device associated with a service provider of the property, one or more communications corresponding to the one or more performance tests of the appliance based at least on results of the one or more performance tests of the appliance.

14. The method of claim 9, wherein:
the appliance represents a component of a HVAC system associated with the property, and
the predicted time for the operational change in usage of the appliance reflects a period of time when the component of the HVAC system is configured to be adjusted from either a cooling setting to a heating setting or a heating setting to a cooling setting.

15. The method of claim 14, wherein the obtained usage data for the appliance comprises temperature set point data from a thermostat associated with the HVAC system, energy consumption data associated with the HVAC system, and data indicating presence of individuals within the property.

16. The method of claim 14, wherein the operation directed to conducting one or more performance tests on the appliance comprises:
measuring a power usage, an operating temperature, and a humidity associated with the component of the HVAC system; and
comparing (i) the measured power usage to a target power usage, (ii) the measured operating temperature to a target operating temperature, and (iii) the measured humidity to a target humidity, wherein each of the values of the target power usage, the target operating temperature, and the target humidity are based on one or more user-defined settings of the property.

17. A non-transitory machine-readable medium storing executable instructions that, when executed by one or more processor, cause the one or more processors to perform operations comprising:
obtaining, by a control unit that is located in the property and from one or more sensors that are located throughout the property and configured to generate sensor data, sensor data for an appliance associated with the property, the obtained sensor data for the appliance indicating past usage activity patterns of the appliance by users of the property and present operational status of the appliance, wherein the control unit is configured to exchange data communications between the one or more sensors, the appliance, a client device of a user from among the users of the property, and a remote server system;
determining, by the control unit and based on the past usage activity patterns of the appliance, a particular anticipated usage activity pattern of the appliance corresponding to the operational change in usage of the appliance;
obtaining, by the control unit, weather forecast data associated with a location of the property;
predicting, by the control unit, a time for an operational change in usage of the appliance based at least on the particular anticipated usage activity pattern for the appliance and the obtained weather forecast data;
before the predicted time for the operational change in usage of the appliance:
identifying, by the control unit, one or more performance tests to perform on the appliance based on the past usage activity patterns of the appliance and the particular anticipated usage activity pattern for the appliance;
determining, by the control unit and based on the past usage activity patterns of the appliance, a time period during which to perform the one or more performance tests, the time period representing times when the appliance is not in use by the users of the property;
performing, by the control unit and at the time period, an operation directed to conducting one or more performance tests on the appliance based on the one or more identified performance tests; and
providing, by the control unit and to the client device of the user from among the users of the property, one or more communications corresponding to the one or more performance tests of the appliance based at least on results of the one or more performance tests of the appliance.

18. The non-transitory machine-readable medium of claim 17, wherein the predicted time for the operational change in usage of the appliance reflects a change in seasonal operation of the appliance within the property.

19. The non-transitory machine-readable medium of claim 17, wherein the operations comprise:
determining to perform a maintenance operation on the appliance based at least on performing an operation directed to conducting the one or more performance tests on the appliance; and
before the predicted time for the operational change in usage of the appliance, transmitting an instruction to the appliance to perform the maintenance operation.

20. The non-transitory machine-readable medium of claim 17, wherein predicting the time for the operational change in usage of the appliance comprises:
obtaining data associated with a plurality of properties determined to be within a threshold proximity to the property;
identifying a subset of the obtained data that is corresponding to the past activity of the appliance and the present operational status of the appliance; and
predicting a time for an operational change in usage of the appliance based at least on the obtained usage data for the appliance, the obtained weather forecast data, and the subset of the obtained data from the plurality of properties.

* * * * *